US008674522B1

(12) United States Patent  (10) Patent No.: US 8,674,522 B1
Pratt et al.  (45) Date of Patent: Mar. 18, 2014

(54) CASTLE-LIKE CHOP MASK FOR FORMING STAGGERED DATALINES FOR IMPROVED CONTACT ISOLATION AND PATTERN THEREOF

(71) Applicants: David Pratt, Meridian, ID (US); Richard Housley, Boise, ID (US)

(72) Inventors: David Pratt, Meridian, ID (US); Richard Housley, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 13/649,125

(22) Filed: Oct. 11, 2012

(51) Int. Cl.
*H01L 47/00* (2006.01)

(52) U.S. Cl.
USPC .................. 257/786; 257/E47.001; 257/5

(58) Field of Classification Search
USPC .............. 257/786, 5, E47.001, E21.004
See application file for complete search history.

(56) References Cited

U.S. PATENT DOCUMENTS

| 8,502,322 | B2* | 8/2013 | Nitta | 257/390 |
| 2012/0025402 | A1* | 2/2012 | Bicksler | 257/786 |
| 2013/0193398 | A1* | 8/2013 | Pellizzer et al. | 257/5 |

* cited by examiner

*Primary Examiner* — Roy Potter
(74) *Attorney, Agent, or Firm* — Winston Hsu; Scott Margo

(57) ABSTRACT

The present invention provides a castle-like shaped protect or a periphery protect or a DC chop mask for forming staggered data line patterns in semiconductor devices so as to shift the adjacent data lines from one another so as to print contacts with larger areas at one end of each data line.

11 Claims, 11 Drawing Sheets

US 8,674,522 B1

CASTLE-LIKE CHOP MASK FOR FORMING STAGGERED DATALINES FOR IMPROVED CONTACT ISOLATION AND PATTERN THEREOF

BACKGROUND OF THE INVENTION

1. Field of the Invention

The present invention generally relates to a device pattern used in a semiconductor process and more precisely to a specific pattern allowing better contacts in a memory device and the mask to form such pattern.

2. Description of the Prior Art

With the trend of miniaturization of the semiconductor devices, word lines and bit lines in memory devices are closer to each other. The development of double patterning techniques have enabled smaller pitches to be obtained. Data lines need to be contacted to the rest of the IC circuit components to enable the transfer of data signal through contact plugs and landing pads.

The miniaturization however raises a problem of short circuits occurring when the contacts formed down to word lines are too close in proximity to adjacent contacts or word lines, or efficiency problems when the contacts are too small. In prior art, specific plugs and landing pads formed through processing many steps are used to avoid the short circuits. These many steps increase both processing time and cost of the device A novel and simplified way to improve contact isolation from each other is therefore an important matter in this field.

SUMMARY OF THE INVENTION

The present invention provides a photolithography mask, sometimes referred to as a protect mask or chop mask, having a specific castle-like shape, as a reference to castle battlements. The castle-like shaped protect mask, or chop mask, is used in conjunction with pitch doubling or pitch multiplication processes to form word lines and digit lines in memory devices, like DRAM for example.

A protect or periphery protect mask is a mask used during photolithography steps to prevent loop ends of spacers to be transferred to underlying substrates during etching. The castle-like shaped mask enables the formation of a staggered pattern of word lines that are alternatively shorter and longer. The staggered word lines pattern leaves a larger area for bigger contacts to be formed, which are also farther from one another, thereby avoiding short circuits and reducing their resistance for better conducting properties.

In another embodiment of the present invention a DC chop mask is presented that is used during the photolithography step for forming digit lines. The DC chop mask also avoids the transfer of the loop ends of a spacer pattern during etching and enables the formation of a staggered pattern of digit lines at the array edge.

In another embodiment, a DC chop mask with an L shaped castle-like mask provides pattern that helps form a larger area of the digit lines to form the contacts thereon through the additional L shaped portion of the line end.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
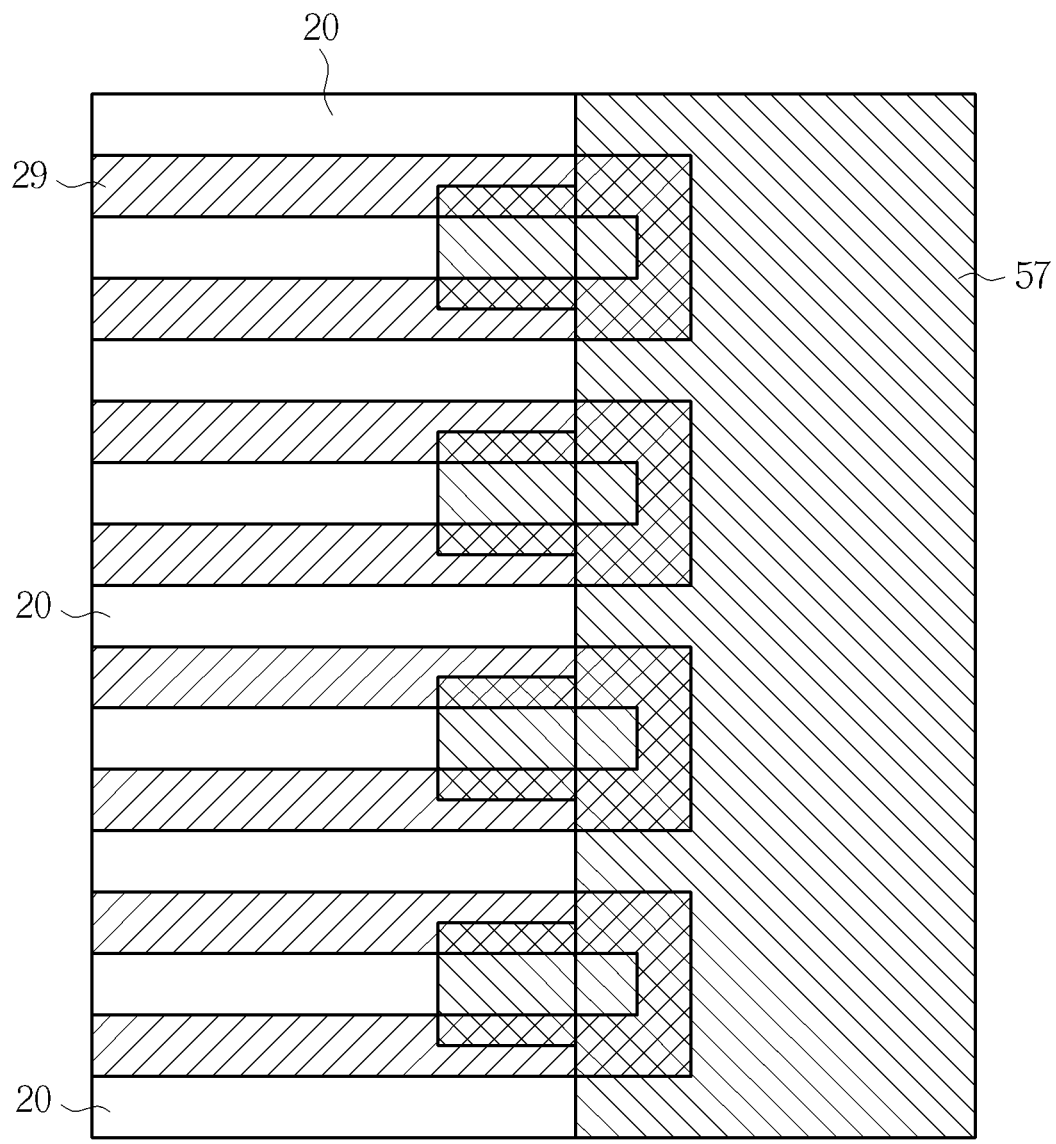
FIGS. 1-3 are top views illustrating a protect or periphery protect mask and a pattern resulting from using such mask according to a first embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The technologies mentioned in the process flow for fabricating the specific data lines design of the present invention are well known to those skilled in the art and will therefore not be described here for clarity and brevity purposes.

Figure 2:
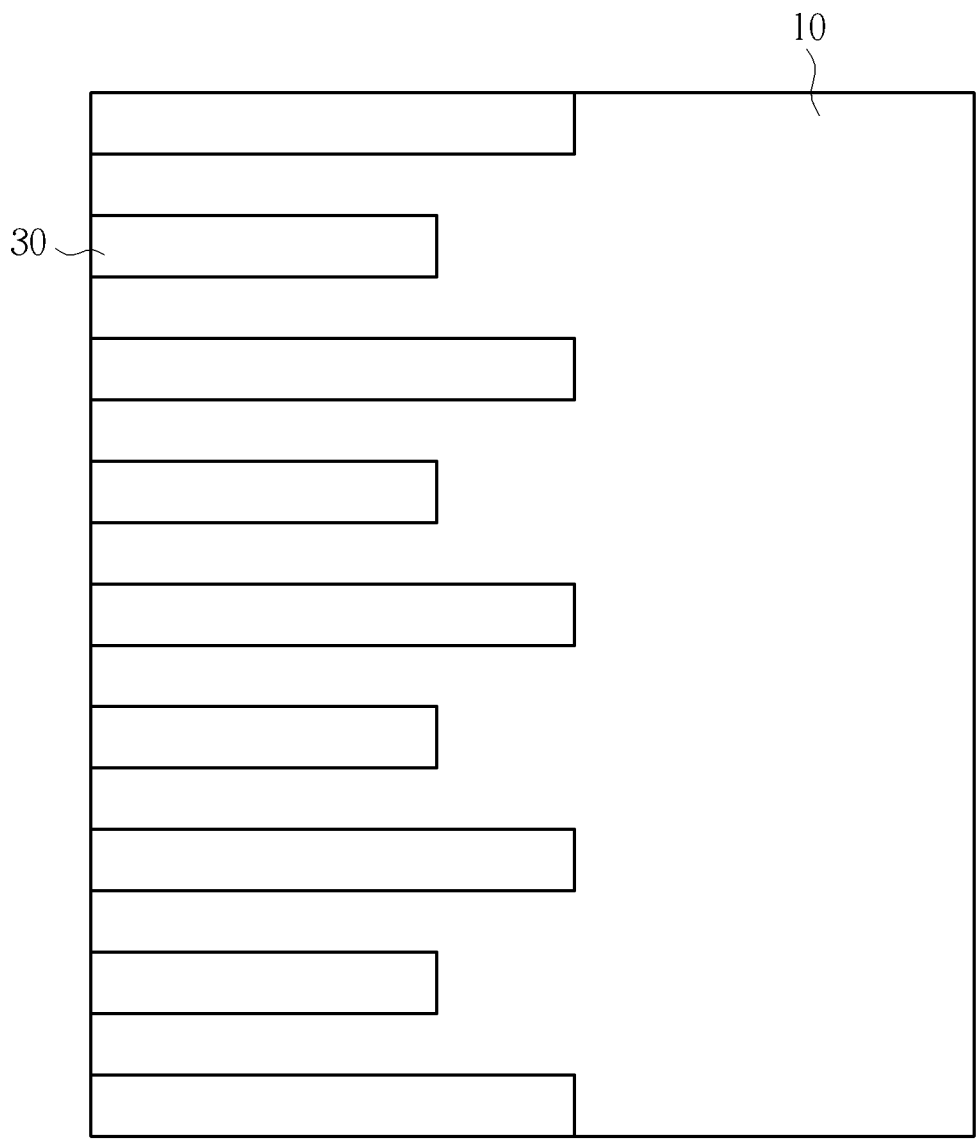

Please refer to FIGS. 1 and 2. FIGS. 1 and 2 are top views of a protect or periphery protect mask 57 according to a first embodiment of the present invention. First, a substrate layer 10 is provided with a stack of materials 20 that may include carbon, DARC (Dielectric Anti Refracting Coating), etc. . . . , which are used in the formation of the word line pattern. The spacer pattern 29 is then formed on top of the substrate stack 20, by ways of pitch doubling or pitch multiplication techniques. The resulting spacer pattern 29 contains loop ends at the array edge. The protect or periphery protect mask 57 has a castle-like shape as a reference to castle battlements shapes, i.e. the protect or periphery protect mask is designed with a succession of squared parts regularly protruding from the main layer of the mask that have a width designed such that the resist edge will snap or self align to the spacer pattern 29. The chop mask 57 is disposed on the array edge of the spacers 29 so that the battlements of the castle-like shape are disposed correspondingly to the spacer loop ends. Etching processes are then performed, thereby forming a desired pattern of staggered trenches 30 into the underlying substrate, as shown in FIG. 2. This staggered array of trenches will ultimately form the wordline pattern. This means that adjacent word lines alternatively end at a shorter distance from the edge and longer distance from the edge on one side of the array, and reciprocally on the other side. This means that all the lines 30 have substantially the same length but are alternatively shifted to the left and to the right, thereby forming larger empty areas between two line ends at the array edge.

Figure 3:
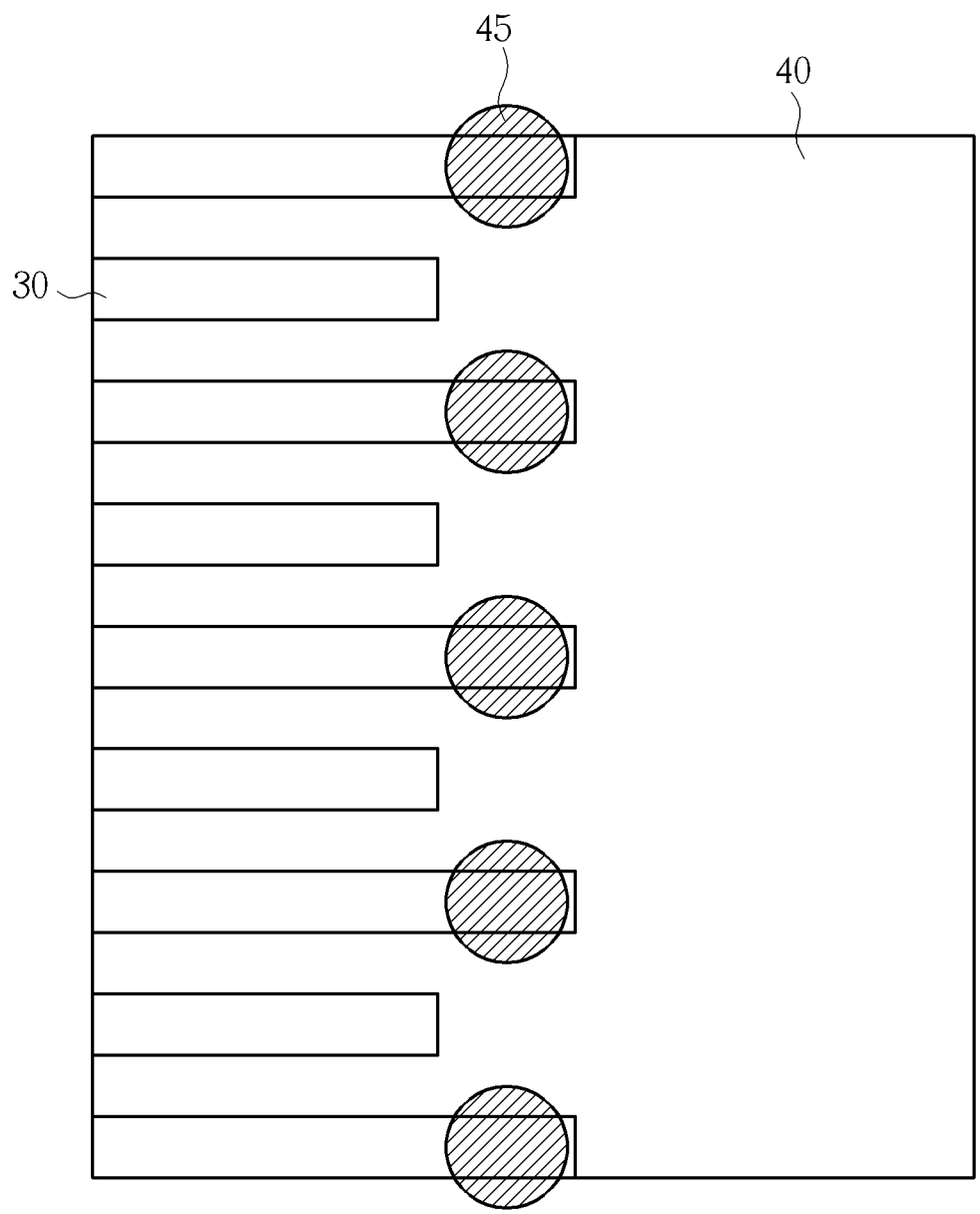
Figure 4:
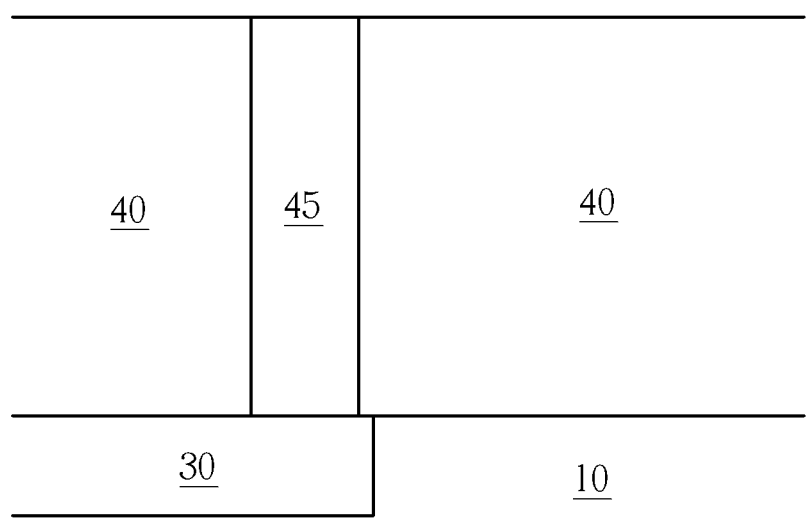
FIG. 4 is a side view illustrating a pattern resulting from using a mask according to a first embodiment of the present invention.

Then, as shown in FIGS. 3 and 4, an oxide layer 40 is conformally formed on the substrate 10 and contacts 45 are formed through traditional single exposure printing processes on the line ends that are closer to the side of the array, i.e. one every two word lines, on each side of the array so that each word line 30 is provided with a contact 45 but alternatively on a different side of the array. This way the contacts 45 can be designed with a larger area without interacting and raising short circuit issues with the contacts of adjacent lines, thereby lowering the resistance, enhancing the performance and avoiding isolation problems in double pitched designs.

Figure 5:
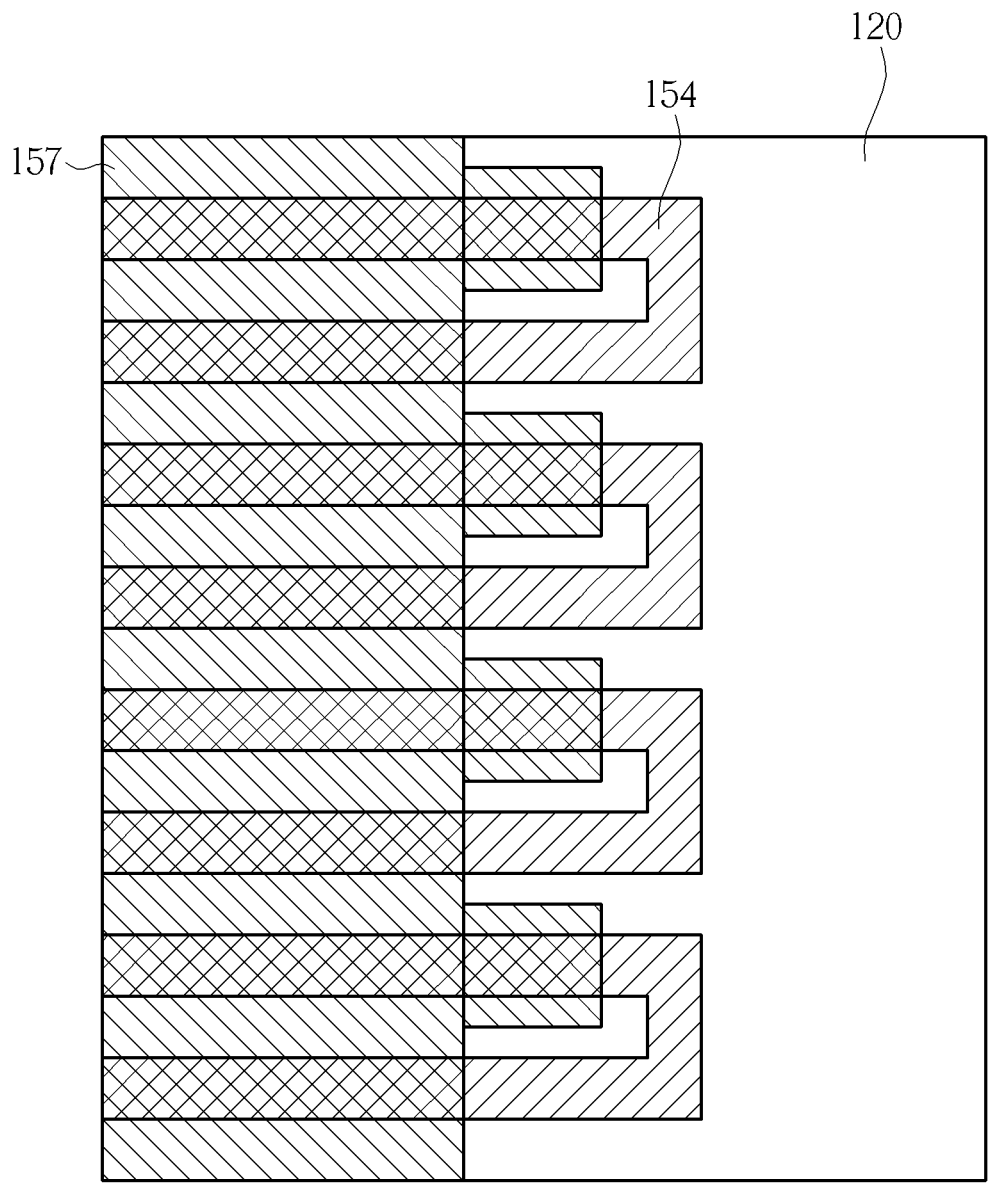
FIGS. 5-7 are top views illustrating a DC chop mask and a pattern resulting from using such mask according to a second embodiment of the present invention.
Figure 6:
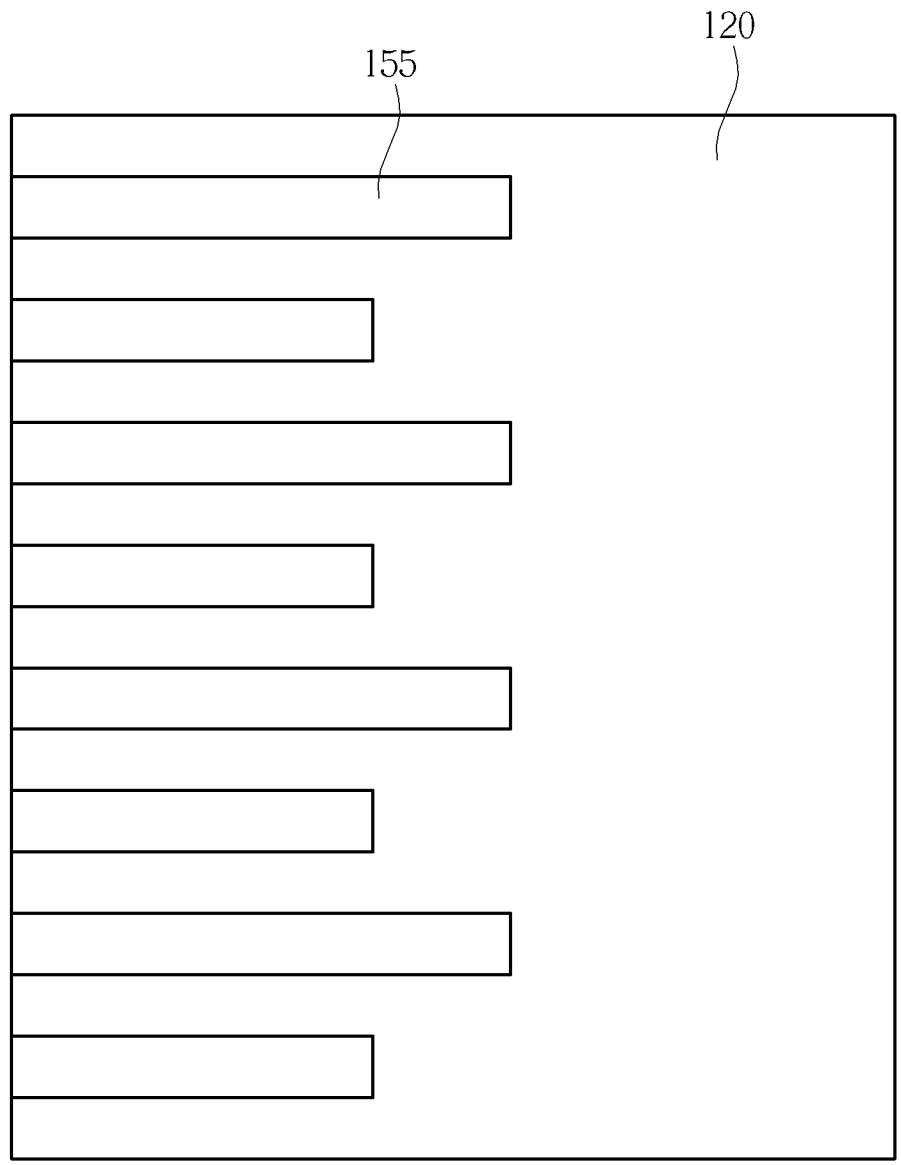

Please refer to FIGS. 5 and 6. FIGS. 5 and 6 are top views of a castle-like shaped DC chop mask 157 according to a second embodiment of the present invention. First, a substrate layer 100 is provided with a stack of materials 120 that may include carbon, DARC, etc. . . . , which are used in the formation of the digit line pattern. The spacer pattern 154 is then formed on top of the substrate stack 120, by ways of pitch doubling or pitch multiplication techniques. The resulting spacer pattern 154 contains loop ends at the array edge. The DC chop mask 157 has a castle-like shape as a reference to castle battlements shapes, i.e. the DC chop mask is designed with a succession of squared parts regularly protruding from the main layer of the mask that have a width designed such that the resist edge snaps or self align to the spacer pattern 154. The DC chop mask is disposed on the array edge of the spacers 154 so that the castle battlement shaped protruding parts of the DC chop mask 157 are disposed correspondingly upon the top parts of the spacer 154 loops. This way, a small part of the top loop end, the loop end part parallel to the edge of the array and a larger bottom part of the loop end are not covered by the chop mask, wherein the exposed bottom part of the loop end is substantially larger than the exposed top part.

As shown in FIG. 6, etching processes are then performed, thereby forming a desired pattern of staggered digit lines 155 designed according to a design defined by the spacer 154 parts previously covered by the DC chop mask. This means that adjacent digit lines alternatively end at a shorter and a longer distance from the edge on one side of the array, and reciprocally on the other side. This means that all the lines 155 have substantially the same length but are alternatively shifted to the left and to the right, thereby forming larger empty areas between two line ends at the edge of the array.

Figure 7:
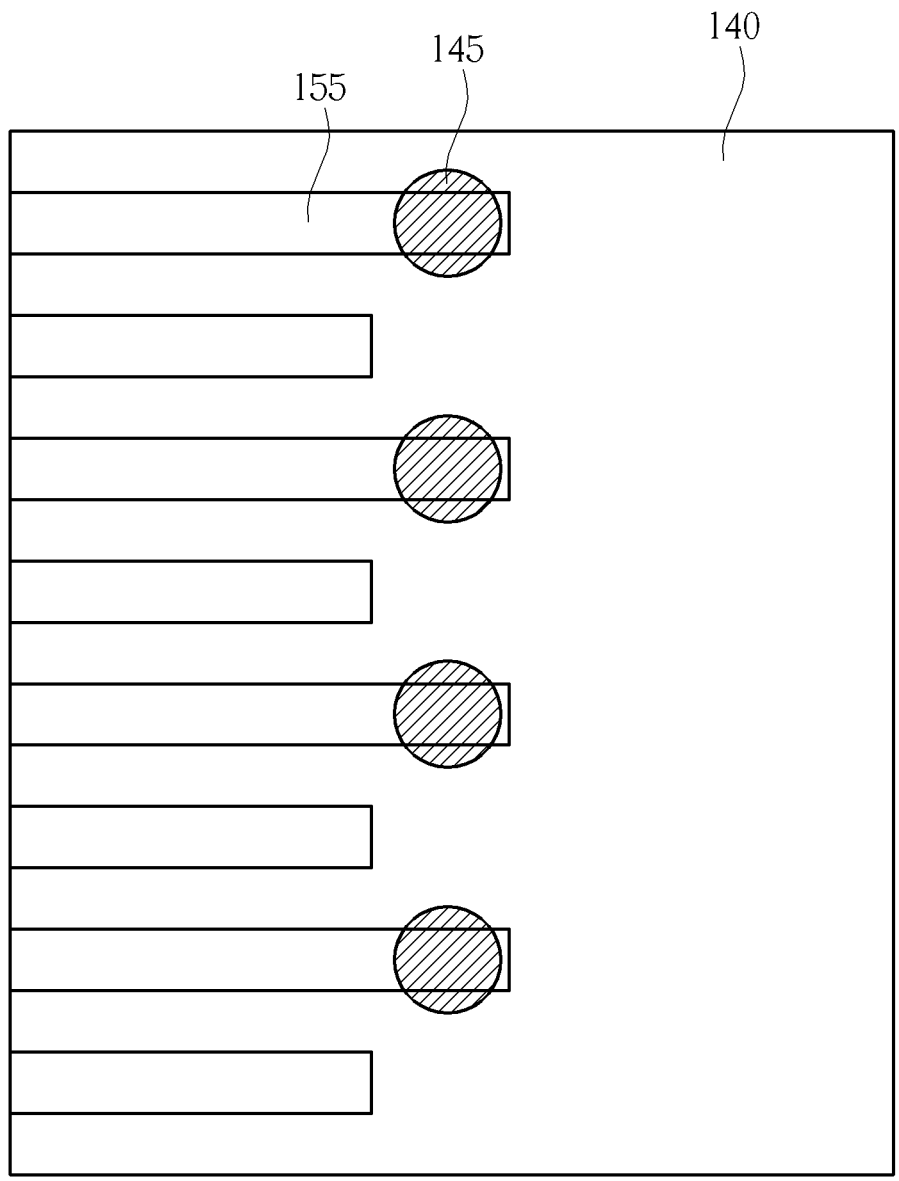
Figure 8:
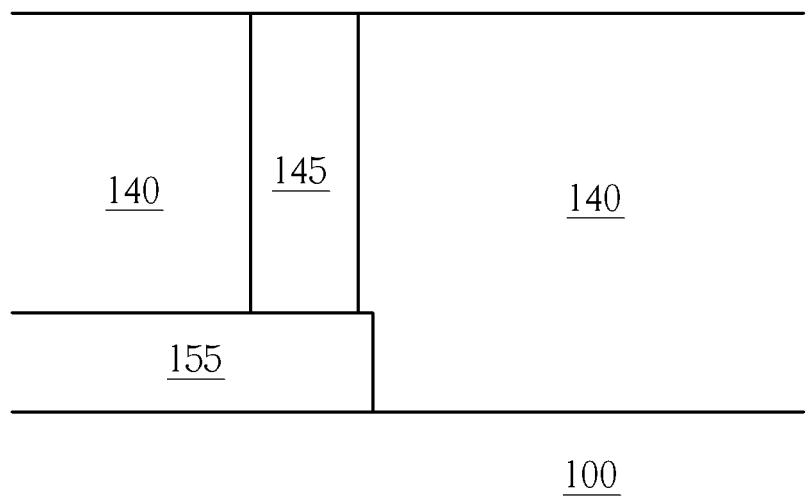
FIG. 8 is a side view illustrating a pattern resulting from using a mask according to a second embodiment of the present invention.

Then, as shown in FIGS. 7 and 8, an oxide layer 140 is formed on the substrate 100 and contacts 145 are formed through traditional single exposure printing processes on the line ends that are closer to the side of the array, i.e. one every two digit lines, on each side of the array so that each digit line 155 is provided with a contact 145 but alternatively on a different side of the array. This way the contacts 145 can be designed with a larger area without interacting and raising short circuit issues with the contacts of adjacent lines, thereby lowering the resistance, enhancing the performance and avoiding isolation problems in double pitched designs.

Figure 9:
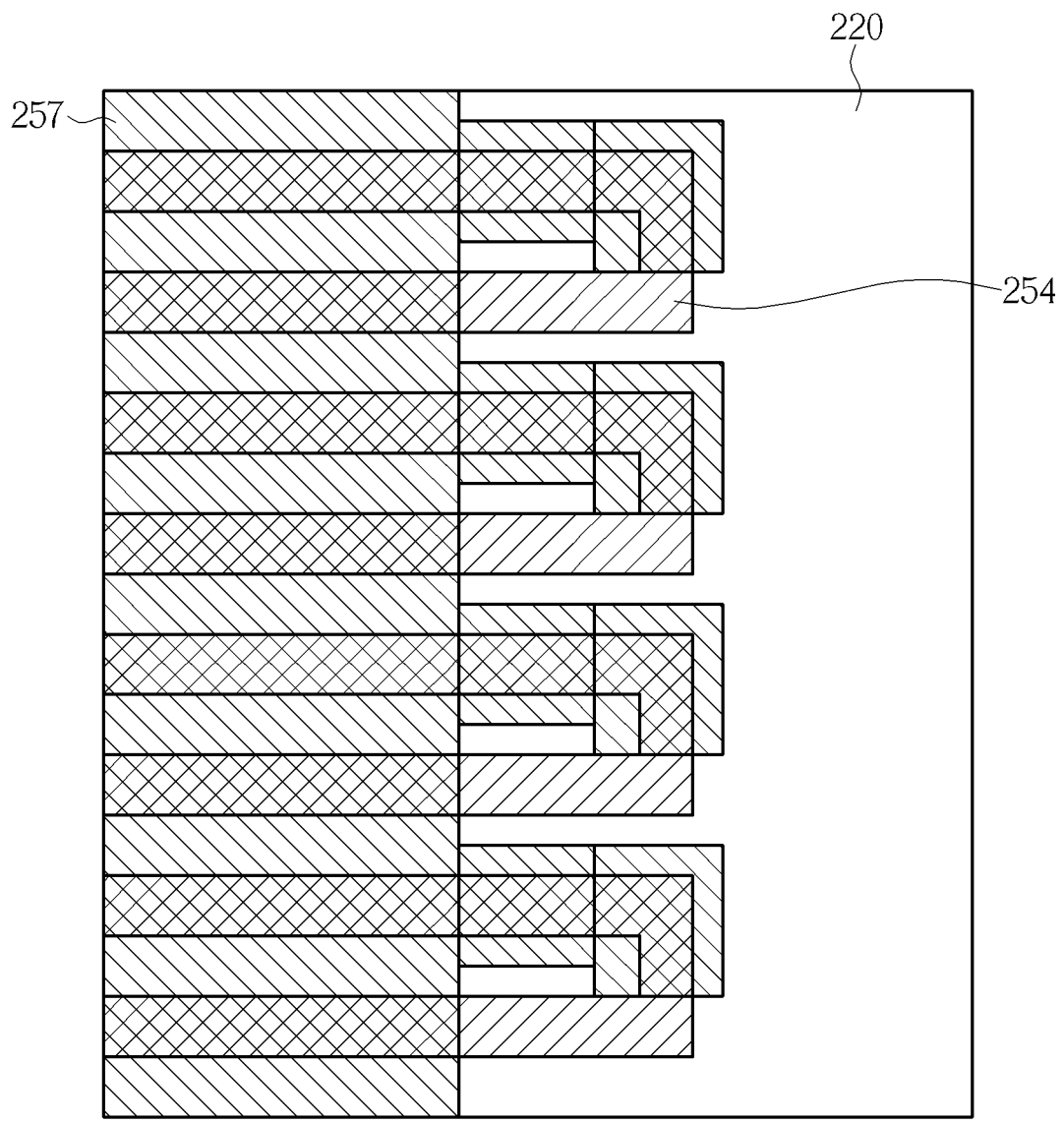
FIGS. 9-11 are top views illustrating a DC chop mask and a pattern resulting from using such mask according to a third embodiment of the present invention.
Figure 10:
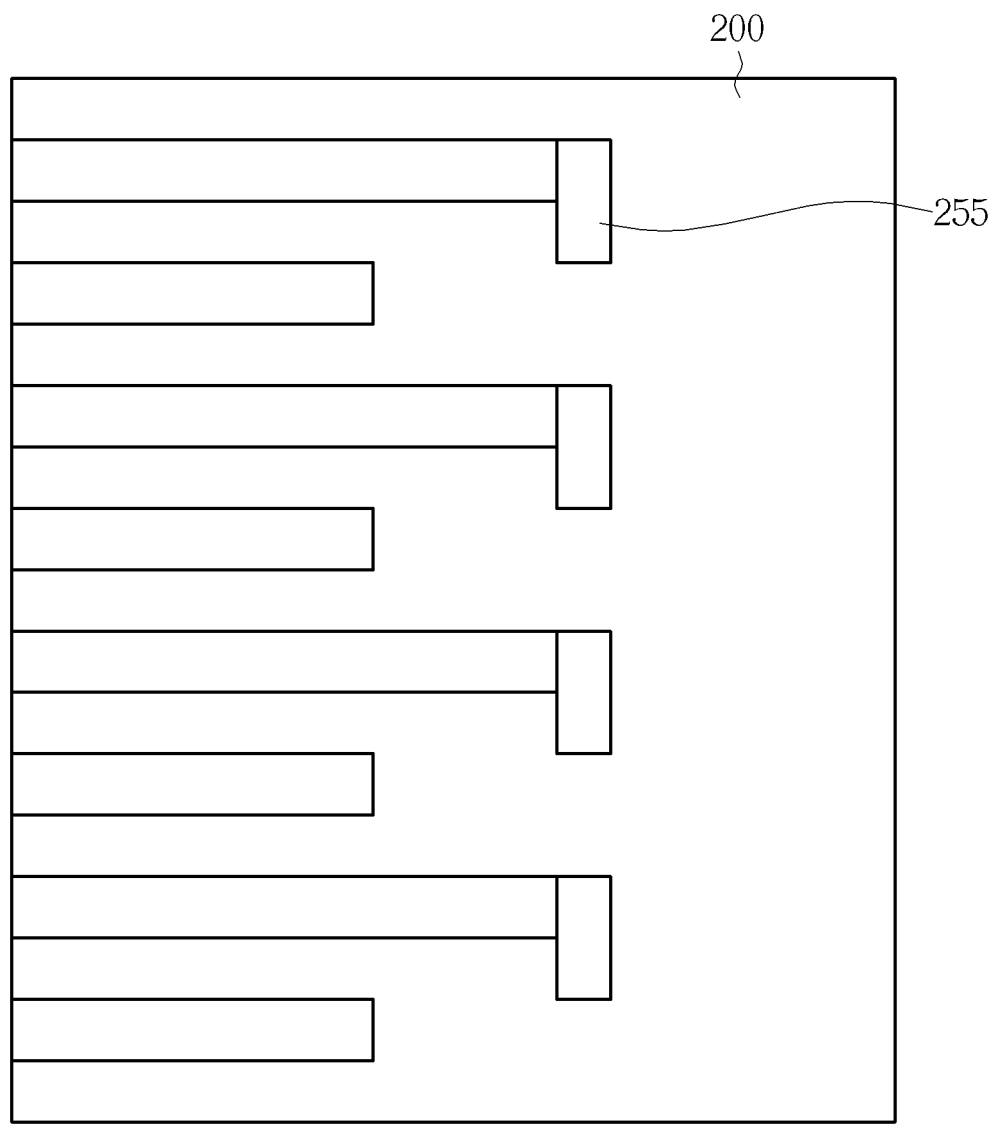

Please refer to FIGS. 9 and 10. FIGS. 9 and 10 are top views of a DC chop mask 257 according to a third embodiment of the present invention. First, a substrate layer 200 is provided with a stack of materials 220 that may include carbon, DARC, etc. . . . , which are used in the formation of the digit line pattern. The spacer pattern 254 is then formed on top of the substrate stack 220, by ways of pitch doubling or pitch multiplication techniques. The resulting spacer pattern 254 contains loop ends at the array edge. The DC chop mask 257 has a castle-like shape similar to the one of the previous embodiment, but with an additional part disposed perpendicularly to the end the protruding part, having the same width as the protruding part, and with a length slightly shorter than the part of the spacer loop that is parallel to the edge of the array. The DC chop mask 257 is disposed on the array edge of the spacers 254 so that the castle battlement shaped protruding parts of the DC chop mask 257 are disposed correspondingly upon the top parts of the spacer 254 loops and the parts of the spacer loops that are parallel to the edge of the array. This way, only a bottom part of the loop end is not covered by the chop mask.

As shown in FIG. 10, etching processes are then performed, thereby forming a desired pattern of staggered digit lines 255 designed according to a design defined by the spacer 254 parts previously covered by the DC chop mask. This means that adjacent digit lines alternatively end at a shorter and a longer distance from the edge on one side of the array, and reciprocally on the other side, wherein the digit lines that end closer to the side of the array have an L shape. This means that all the lines 255 have substantially the same length but are alternatively shifted to the left and to the right, thereby forming larger empty areas between two line ends at the array edge, and forming a larger contact area between the digit line 255 and the contact 245.

Figure 11:
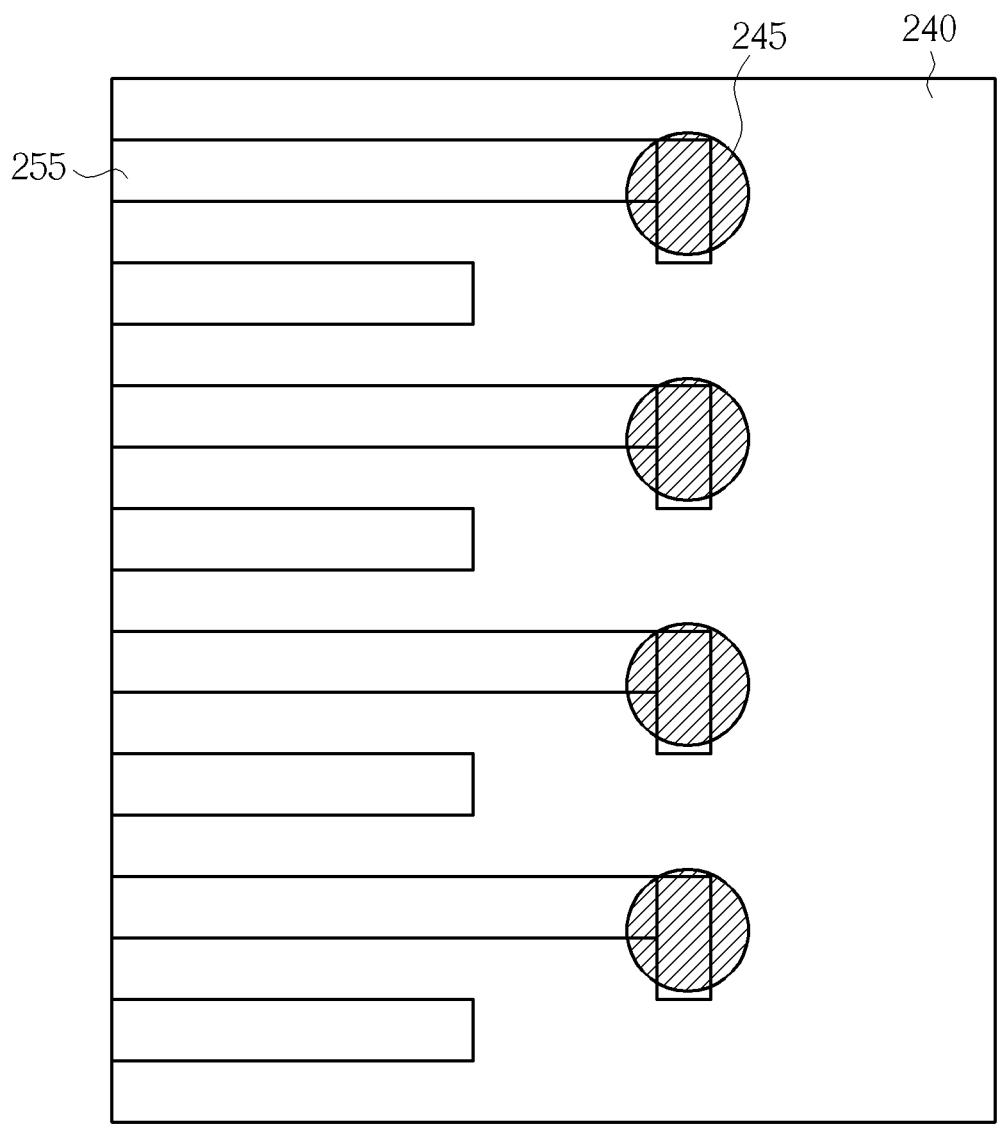

Then, as shown in FIG. 11, an oxide layer 240 is formed on the substrate 200 and contacts 245 are formed through traditional single exposure printing processes on the line ends that are closer to the side of the array, i.e. one every two digit lines, on each side of the array so that each digit line 255 is provided with a contact 245 but each alternatively on a different side of the array. This way the contacts 245 can be designed with a larger area without interacting and raising short circuit issues with the contacts of adjacent lines and a larger contact area between the contact 245 and the digit line 255, thereby lowering even more the resistance, enhancing the performance and avoiding isolation problems in double pitched designs.

To summarize, the present invention provides a specifically castle-like shaped mask to pattern staggered trenches and lines on memory array edges, which leaves a larger area for contacts between the data lines and the rest of the device, so that contacts can be formed in smaller double pitched designs without provoking short circuits between contacts, but still ensuring large enough contact areas for good performances through a limited process flow, thereby saving time and costs of manufacturing.

Those skilled in the art will readily observe that numerous modifications and alterations of the device and method may be made while retaining the techniques of the invention. Accordingly, the above disclosure should be construed as limited only by the metes and bounds of the appended claims.

What is claimed is:

1. A protect or periphery protect mask used in lithography processes,
    characterized in that a shape of the chop mask is similar to battlements of a castle with a regular succession of protruding parts and notches,
    that is used to pattern staggered word line trenches in a memory array from a previously formed rectangular shaped spacer loops through lithography and etching processes by disposing the protruding part and the notch alternatively on previously formed spacer loops.

2. A protect or periphery protect mask according to claim 1, wherein a width of each protruding part of the chop mask is substantially larger than that of the spacers.

3. A pattern of staggered word lines obtained through using the protect or periphery protect mask of claim 1,
    wherein adjacent word lines are alternatively shifted to one side then the other side of the memory array.

4. A pattern of staggered word lines according to claim 3, wherein contacts are printed at the one end of each word line that is closer to the side of the memory array.

5. A chop mask used in lithography processes,
    characterized in that a shape of the chop mask is similar to battlements of a castle with a regular succession of protruding parts and notches, that is used to pattern staggered digit lines in a memory array from a previously formed rectangular shaped spacer loops through lithography and etching processes by alternatively disposing the protruding parts on previously formed adjacent top spacer loop parts and the notches on the bottom spacer loop parts.

6. A chop mask according to claim 5, wherein a width of each protruding part is designed so the resist edge snaps to or self aligns to the spacers.

7. A pattern of staggered digit lines obtained through using the chop mask of claim 5,
   wherein adjacent said digit lines are alternatively shifted to one side then the other side of the memory array.

8. A pattern of staggered digit lines according to claim 7, wherein contacts are printed at the one end of each said digit line that is closer to the side of the memory array.

9. A chop mask according to claim 5, wherein the protruding part has an L-shaped end to cover the top and the side part of a rectangular shaped spacer loop fully.

10. A pattern of staggered digit lines obtained through using the chop mask of claim 9,
    wherein adjacent said digit lines are alternatively shifted to one side then the other side of the memory array.

11. A pattern of staggered digit lines according to claim 9, wherein a contact is printed at the L shaped end of each said digit line.

* * * * *